United States Patent [19]
Ghannouchi et al.

[11] Patent Number: 5,789,976
[45] Date of Patent: Aug. 4, 1998

[54] DIGITAL ADAPTIVE CONTROL OF FEEDFORWARD AMPLIFIER USING FREQUENCY DOMAIN CANCELLATION

[75] Inventors: Fadhel M. Ghannouchi, Montréal; Guoxiang Zhao, Verdun; Francois Beauregard, Laprairie; Apmar B. Kouki, Montréal, all of Canada

[73] Assignee: Corporation de l'Ecole Polytechnique, Montreal, Canada

[21] Appl. No.: 672,508

[22] Filed: Jun. 17, 1996

[51] Int. Cl.$^6$ ...................................................... H03F 1/32
[52] U.S. Cl. ........................... 330/52; 330/149; 330/151
[58] Field of Search ........................... 330/52, 136, 149, 330/151; 375/297; 455/63

[56] References Cited

U.S. PATENT DOCUMENTS

| | | | |
|---|---|---|---|
| 3,922,617 | 11/1975 | Denniston et al. | 330/149 |
| 4,379,994 | 4/1983 | Bauman | 330/149 |
| 4,389,618 | 6/1983 | Bauman | 330/149 |
| 4,394,624 | 7/1983 | Bauman | 330/151 |
| 4,412,185 | 10/1983 | Gerard | 330/149 |
| 4,517,521 | 5/1985 | Preschutti et al. | 330/2 |
| 4,560,945 | 12/1985 | Olver | 330/149 |
| 4,879,519 | 11/1989 | Myer | 330/149 |
| 4,885,551 | 12/1989 | Myer | 330/149 |
| 4,926,134 | 5/1990 | Olver | 330/2 |
| 5,051,704 | 9/1991 | Chapman et al. | 330/52 |
| 5,077,532 | 12/1991 | Obermann et al. | 330/151 |
| 5,148,117 | 9/1992 | Talwar | 330/151 |
| 5,157,345 | 10/1992 | Kenington et al. | 330/149 |
| 5,166,634 | 11/1992 | Narahashi et al. | 330/151 |
| 5,323,119 | 6/1994 | Powell et al. | 330/151 |
| 5,327,096 | 7/1994 | Sakamoto et al. | 330/151 |
| 5,386,198 | 1/1995 | Ripstrand et al. | 330/52 |
| 5,396,189 | 3/1995 | Hays | 330/149 |
| 5,477,187 | 12/1995 | Kobayashi et al. | 330/52 |
| 5,485,120 | 1/1996 | Anvari | 330/151 |
| 5,489,875 | 2/1996 | Cavers | 330/151 |
| 5,493,252 | 2/1996 | Takai | 330/52 |
| 5,508,657 | 4/1996 | Behan | 330/151 |
| 5,594,385 | 1/1997 | Anvari | 330/151 X |
| 5,617,061 | 4/1997 | Fukuchi | 330/151 |

OTHER PUBLICATIONS

"A microwave feed–forward experiment" H. Seidel, Bell Syst. Tech. J. vol. 50, No. 9, pp. 2879–2918, Nov. 1971.
"A wide–Band Feedforward Amplifier" R.G. Meyer, R. Eschenbach and W.M. Edgerley, Jr. IEEE Journal of Solid–State Circuits, vol. SC–9, No. 6, pp. 422–428, Dec. 1974.

(List continued on next page.)

*Primary Examiner*—James B. Mullins
*Attorney, Agent, or Firm*—Merchant, Gould, Smith, Edell, Welter & Schmidt, P.A.

[57] ABSTRACT

A feedforward amplifier system comprises a main amplifier and an auxiliary amplifier. An input signal including one carrier signal used as a first pilot signal, is supplied to a main amplifier to produce an amplified output signal. A second pilot signal is injected into the amplified output signal. The amplified output signal from the main amplifier is supplied to an output of the amplifier system through a delay line. In each of a first loop associated to the main amplifier and a second loop including the auxiliary amplifier, two control signals with pilot signal components are produced, discrete Fourier transforms of the pilot signal components of the two control signals are calculated, and the amplitude and phase of the input signal of the main or auxiliary amplifiers are adjusted to values making the two Fourier transforms substantially equal to each other. Alternatively, the first pilot signal is produced by a generator and is injected into the input signal. With this alternative, the signal processing is unchanged but a bandpass filter is added at the system output to withdraw the first pilot signal.

29 Claims, 4 Drawing Sheets

OTHER PUBLICATIONS

"A 6–18 Ghz High Dynamic Range MMIC Amplifier Using a Feedforward Technique" V.Steel, D.Scott and S.Ludvik, IEEE MTT–S Digest, 1990, pp. 911–914.

"Specification of error amplifiers for use in feedforward transmitters" R.J.Wilkinson and P.B.Kenington, IEE Proceeding–G, vol. 139, No. 4, pp. 477–480, Aug. 1992.

"Effect of delay mismatch on a feedforward amplifier" K.J.Parsons and P.B. Kenington IEE Proc–Circuits Devices Syst. vol. 141, No. 2, pp. 140–144, Apr. 1994.

"Efficiency of feedforward amplifiers" P.B.Kenington, IEE Proceedings–G, vol. 139 No. 5, pp. 591–593, Oct. 1992.

"The Efficiency of a Feedforward Amplifier with Delay Loss" K.J. Parsons and P.B. Kenington, IEEE Trans. on Vehicular Technology, vol. 43, No. 2, pp. 407–412, May 1994.

"Extremely Low–Distortion Multi–Carrier Amplifier—Self–Adjusting Feed–Forward (SAFF) Amplifier" S.Narahashi and T.Nojima, Proc. IEEE Commun. Conf. 1991, pp. 1485–1490.

"Memory controlled feedforward lineariser suitable for MMIC implementation" S.Kumar and G.Wells, IEE Proceedings–H, vol. 138, No. 1, pp. 9–12, Feb. 1991.

"Reduction of Noise and Distortion in Amplifiers Using Adaptive Cancellation" A.K. Talwar, IEEE Trans. on MTT, vol. 42, No. 6, pp. 1086–1087, Jun. 1994.

"Adaptation Behavior of a Feedforward Amplifier Linearizer" J.K.Cavers, IEEE Trans. on Vehicular Technology, vol. 44, No. 1, pp. 31–40, Feb. 1995.

"Optimal Feedforward Linearization System Design" E. E. Eid, F. M. Ghannouchi and F.Beauregard, Microwave Journal, Nov. 1995, p. 78.

DIGITAL ADAPTIVE CONTROL OF FEEDFORWARD AMPLIFIER USING FREQUENCY DOMAIN CANCELLATION

BACKGROUND OF THE INVENTION

1. Field of the Invention

The present invention relates to the field of feedforward amplifiers, and more specifically to a digital adaptive control based on the frequency domain cancellation approach.

2. Brief Description of the Prior Art

Power amplifier linearization plays an important role in a variety of advanced communication systems.

Feedforward linearization is one of three popular approaches that are used for that purpose: predistortion, feedback and feedforward. Comparing with the other two methods, the main advantages of the feedforward approach are an unconditional stability over large frequency bandwidths without its inherent frequency limitation, and a high degree of distortion cancellation in spite of the order of the distortion products.

Therefore, in the 1970's, people's interest in the use of feedforward amplifiers operating at high frequencies reappeared (see the articles of H. Seidel, "A microwave feedforward experiment", Bell Syst. Tech., J., Vol. 50, No. 9, pp. 2879–2918, November 1971; and R. G. Meyer, R. Eschenbach and W. M. Edgerley, JR., "A wide-Band Feedforward Amplifier", IEEE Journal of Solid-State Circuits, Vol. SC-9, No. 6, pp. 422–428, December 1974). With the rapid development of satellites, mobiles, cellular radios and PCS communication systems, a common broadband power amplifier for a multi-channel usage is eagerly desired. This demand has been stimulating continuous investigation of the feedforward linearization technique.

The feedforward performance critically relies onto the accuracy of a subtraction of two low level signals, and this requirement is not easy to satisfy over a wide bandwidth. The effects and the causes of the amplitude and phase unbalance have been analysed in several papers, for example R. G. Meyer, R. Eschenbach and W. M. Edgerley, JR., "A wide-Band Feedforward Amplifier", IEEE Journal of Solid-State Circuits, Vol. SC-9, No. 6, pp. 422–428, December 1974; and K. J. Parsons and P. B. Kenington, "Effect of delay mismatch on a feedforward amplifier", IEEE Proc.—Circuits Devices Syst., Vol. 141, No. 2, pp. 140–144, April 1994. The efficiency of feedforward amplifiers has been also taken into consideration (P. B. Kenington, "Efficiency of feedforward amplifiers", IEEE Proceedings-G, Vol. 139, No. 5, pp. 591–593; and K. J. Parsons and P. B. Kenington, "The Efficiency of a Feedforward Amplifier with Delay Lose", IEEE Trans. on Vehicular Technology, Vol. 43, No. 2, pp. 407–412, May 1994). In addition, the success of the feedforward technique depends on its ability to adaptively adjust to changes in temperature or other operation conditions. Several patents have proposed different implementations of this technique. However, few published papers (S. Narahashi and T. Nojima, "Extremely Low-Distortion Multi-Carrier Amplifier—Self-Adjusting Feed-Forward (SAFF) Amplifier", Proc. IEEE Commun. Conf. 1991, pp. 1485–1490; and A. K. Talwar, "Reduction of Noise and Distortion in Amplifiers Using Adaptive Cancellation", IEEE Trans. on MTT, Vol. 42, No. 6, pp. 1086–1087, June 1994) have described their adaptive control schemes. The first analysis of adaptation behaviour in the gradient feedforward linearizers was given by J. K. Cavers in 1955 (J. K. Cavers, "Adaptation behaviour of a Feedforward Amplifier Linearizer", IEEE Trans. on Vehicular Technology, Vol. 44, No. 1, pp. 31–40, February 1995).

OBJECTS OF THE INVENTION

The main object of the present invention is to improve the performance of an adaptive feedforward amplifier through the use of frequency domain cancellation approach.

SUMMARY OF THE INVENTION

More specifically, in accordance with the present invention, there is provided an adaptively controlled amplifier system comprising:

an amplifier having an amplifier input supplied with an input signal including a pilot signal and an amplifier output, the amplifier being responsive to the input signal on the amplifier input to produce on the amplifier output an amplified output signal having a pilot signal component;

means responsive to the input signal for producing a reference signal having a pilot signal component;

means responsive to the amplified output signal for producing an adjustable signal having a pilot signal component; and an adaptive control unit having means for calculating a first Fourier transform of the pilot signal component of the first control signal, means for calculating a second Fourier transform of the pilot signal component of the adjustable signal, and means for adjusting the amplitude and phase of the input signal before being supplied to the amplifier input, to values making the first Fourier transform substantially equal to the second Fourier transform.

The use of Fourier transforms presents, amongst others, the following advantages:

the use of an in-line integrated DSP (Digital Signal Processor) is enabled;

the use of an in-line pilot tone as pilot signal is enabled;

correction for the imperfections of the hardware is enabled; and in-line convergence time is very fast.

In accordance with the present invention, there is also provided a feedforward amplifier system comprising:

an amplifier system input for receiving an input signal including a pilot signal;

an amplifier system output;

a main amplifier having a main amplifier input supplied with the input signal, the main amplifier being responsive to the input signal on the main amplifier input to produce an amplified output signal having a pilot signal component and supplied to the amplifier system output;

an adaptive control loop including:

means responsive to the input signal for producing a reference signal having a pilot signal component;

means responsive to the amplified output signal from the main amplifier for producing an adjustable signal having a pilot signal component; and an adaptive control unit having means for calculating a first Fourier transform of the pilot signal component of the reference signal, means for calculating a second Fourier transform of the pilot signal component of the adjustable signal, and means interposed between the amplifier system input and the main amplifier input for adjusting the amplitude and phase of the input signal to values making the first Fourier transform substantially equal to the second Fourier transform; and means responsive to the reference and adjustable signals and to the amplified output signal for producing a distortion canceling signal injected onto the amplifier system output to cancel a distortion component of the amplified output signal.

Further according to the invention, there is provided a feedforward amplifier system comprising:

an amplifier system input for receiving an input signal;

an amplifier system output;

a main amplifier having a main amplifier input supplied with the input signal and a main amplifier output, the main amplifier being responsive to the input signal on the main amplifier input to produce on the main amplifier output an amplified output signal having a distortion component;

means for injecting a pilot signal into the amplified output signal on the main amplifier output;

means for transmitting the amplified output signal including the pilot signal and the distortion component from the main amplifier output to the amplifier system output;

means responsive to the input signal and the amplified output signal on the main amplifier output for adjusting the amplitude and phase of the input signal on the main amplifier input to values establishing a given relationship between a given signal component of the input signal and a given signal component of the amplified output signal;

means responsive to the input signal and the amplified output signal on the main amplifier output for producing an error signal representative of the distortion component of the amplified output signal and including a pilot signal component;

an auxiliary amplifier for amplifying the error signal to produce an amplified error signal including a pilot signal component and a distortion component;

means responsive to the amplified output signal on the amplifier system output for producing a reference signal having a pilot signal component;

means responsive to the amplified error signal for producing an adjustable signal having a pilot signal component and a distortion canceling signal injected onto the amplifier system output to cancel a distortion component of the amplified output signal; and an adaptive control unit having means for calculating a third Fourier transform of the pilot signal component of the reference signal, means for calculating a fourth Fourier transform of the pilot signal component of the adjustable signal, and means for adjusting the amplitude and phase of the error signal supplied to the auxiliary amplifier to values making the third Fourier transform substantially equal to the fourth Fourier transform.

Finally, the present invention relates to a feedforward amplifier system comprising:

an amplifier system input for receiving an input signal including a first pilot signal;

an amplifier system output;

a main amplifier having a main amplifier input supplied with the input signal and a main amplifier output, the main amplifier being responsive to the input signal on the main amplifier input to produce on the main amplifier output an amplified output signal having a first pilot signal component and a distortion component;

means for injecting a second pilot signal into the amplified output signal;

means for transmitting the amplified output signal including the second pilot signal from the main amplifier output to the amplifier system output;

a first adaptive control loop including:

means responsive to the input signal for producing a first reference signal having a first pilot signal component;

means responsive to the amplified output signal on the main amplifier output for producing a first adjustable signal having a first pilot signal component, a second pilot signal component and a distortion component; and an adaptive control unit having means for calculating a first Fourier transform of the first pilot signal component of the first reference signal, means for calculating a second Fourier transform of the first pilot signal component of the first adjustable signal, and means interposed between the amplifier system input and the main amplifier input for adjusting the amplitude and phase of the input signal to values making the first Fourier transform substantially equal to the second Fourier transform; and a second adaptive control loop including;

means for producing an error signal representative of a difference between the first reference and adjustable signals and including a second pilot signal component and a distortion component;

an auxiliary amplifier for amplifying the error signal to produce an amplified error signal;

means responsive to the amplified output signal on the amplifier system output for producing a second reference signal having a second pilot signal component;

means responsive to the amplified error signal for producing a second adjustable signal having a second pilot signal component and a distortion canceling signal injected onto the amplifier system output to cancel a distortion component of the amplified output signal; and an adaptive control unit having means for calculating a third Fourier transform of the second pilot signal component of the second reference signal, means for calculating a fourth Fourier transform of the second pilot signal component of the second adjustable signal, and means for adjusting the amplitude and phase of the error signal supplied to the auxiliary amplifier to values making the third Fourier transform substantially equal to the fourth Fourier transform.

In accordance with preferred embodiments:

the transmitting means comprises a delay line for interconnecting the main amplifier output to the amplifier system output;

the means for producing a reference signal comprises a directional coupler for dividing the input signal into a first input signal portion and a second input signal portion supplied to the main amplifier input, and an attenuator and delay line combination for attenuating and phase shifting the first input signal portion in order to produce the first reference signal having a first pilot signal component;

the means for producing a first adjustable signal comprises a directional coupler for extracting a portion of the amplified output signal on the main amplifier output, and an attenuator for attenuating the portion of the amplified output signal to produce the first adjustable signal;

the means for producing an error signal comprises means for calculating a difference between the first reference and adjustable signals;

the means for producing a second reference signal comprises a directional coupler for extracting the second reference signal from the amplified output signal on the amplifier system output;

the means for producing a second adjustable signal and a distortion canceling signal comprises a directional coupler for dividing the amplified error signal into the second adjustable signal and the distortion canceling signal;

the reference and adjustable signals are analog signals, each means for calculating a Fourier transform comprises (a) an analog-to-digital converter for converting the analog reference or adjustable signal to a digital signal, (b) filter means for extracting the pilot signal component from the digital signal, and (c) digital means for calculating a discrete Fourier transform of the pilot signal component of the digital signal;

each means for calculating a Fourier transform further comprises an analog input low pass filter for limiting noise and providing anti-aliasing protection, the analog reference or adjustable signal being transmitted to the analog-to-digital converter through the analog input low pass filter;

each means for calculating a Fourier transform further comprises means interposed between the analog-to-digital converter and the filter means for multiplying the digital signal by a first calibration factor; and the amplitude and phase adjusting means comprises a vector modulator, means for calculating a ratio between two Fourier transforms, and means for controlling the vector modulator in relation to the calculated ratio to make the calculated ratio equal to 1.

When the input signal contains no carrier frequency, the first pilot signal can be produced by a generator and injected into the input signal. Signal processing remains the same but a bandpass filter is added at the amplifier system output to block the first pilot signal component.

The objects, advantages and other features of the present invention will become more apparent upon reading of the following non restrictive description of a preferred embodiment thereof, given by way of example only with control to the accompanying drawings.

DETAILED DESCRIPTION OF THE PREFERRED EMBODIMENT

Figure 1:
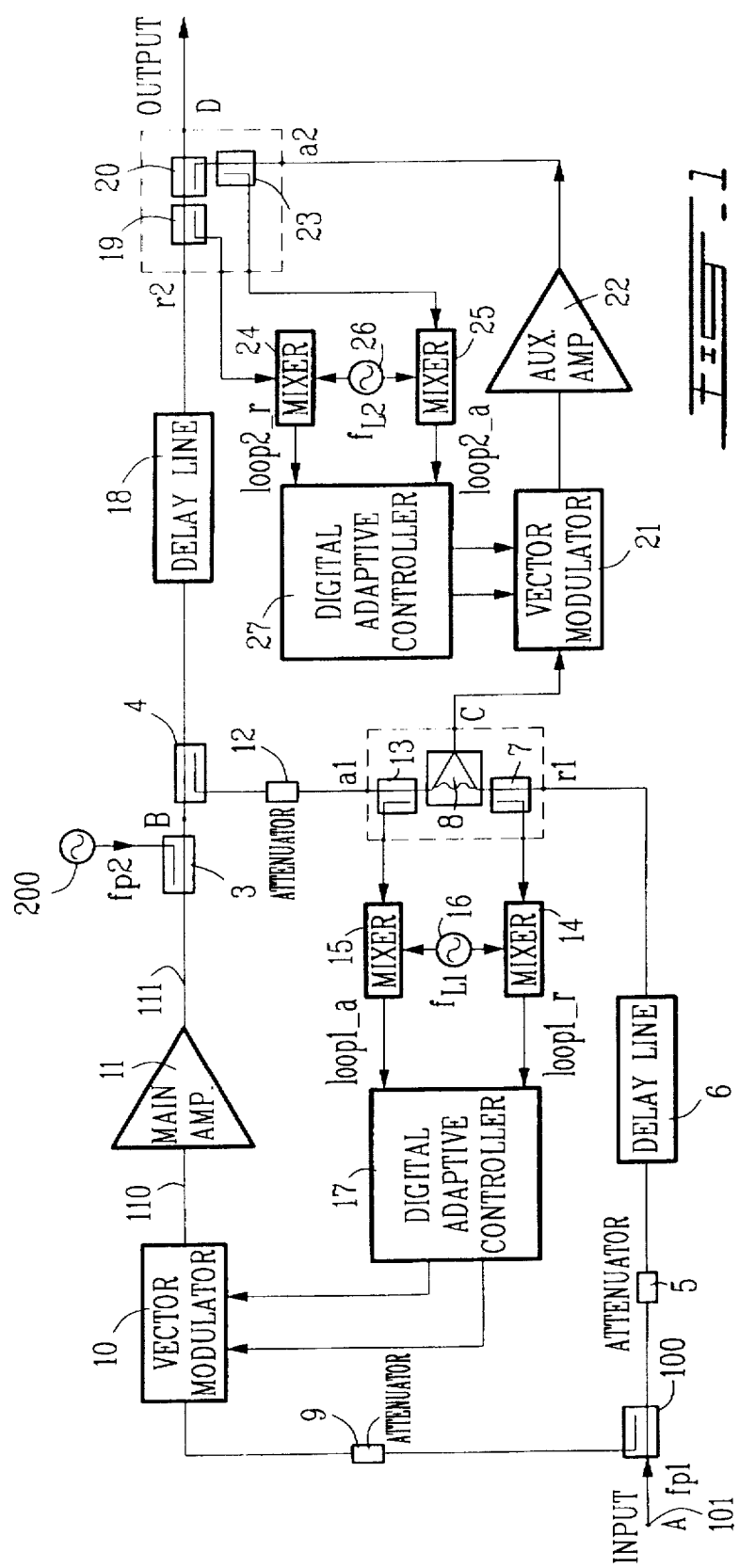
FIG. 1 is a block diagram illustrating the circuit of an adaptive feedforward amplifier system.
Figure 2:
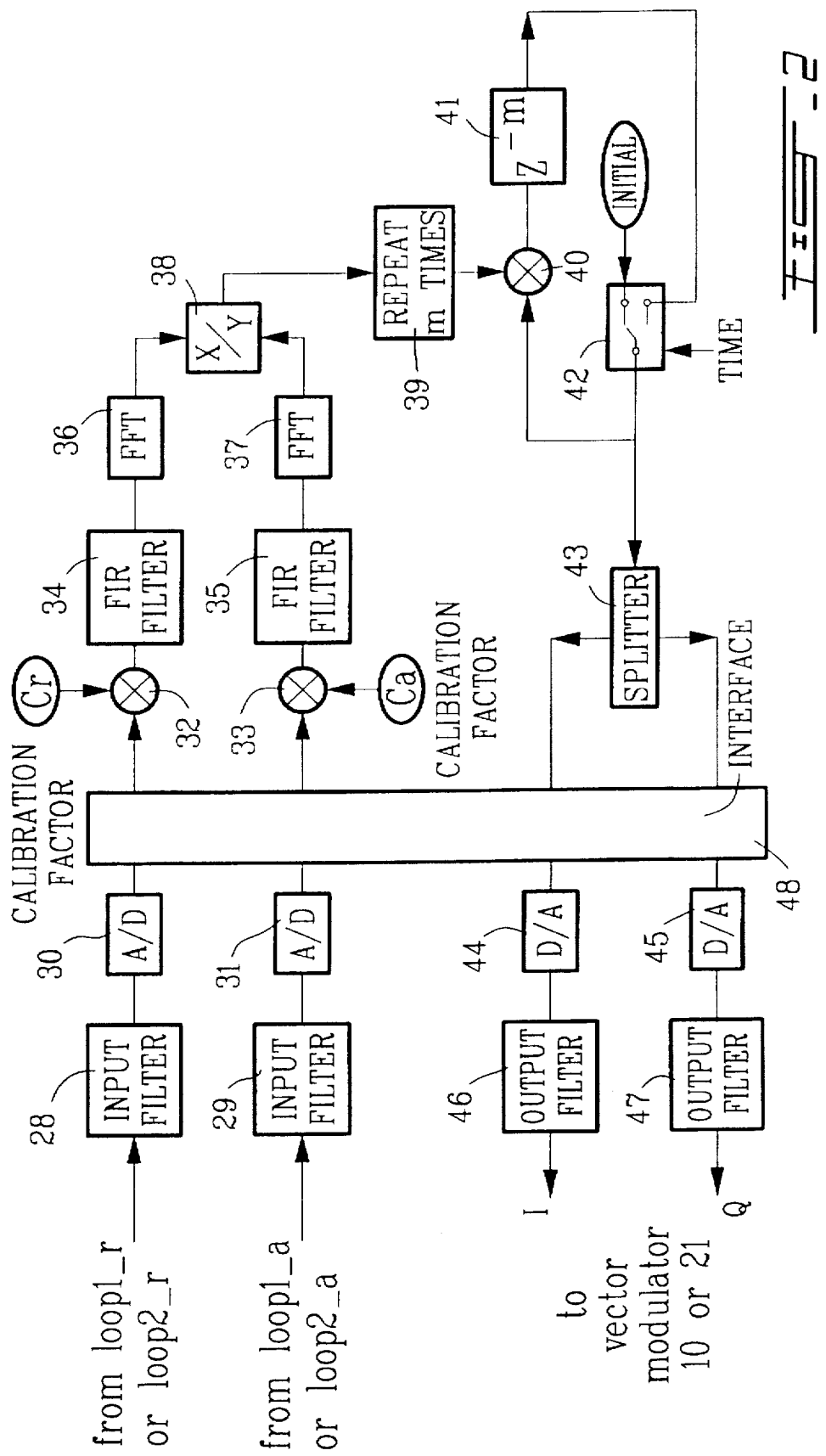
FIG. 2 is a block diagram illustrating a digital adaptive controller used in the adaptive feedforward amplifier system of FIG. 1.
Figure 3:
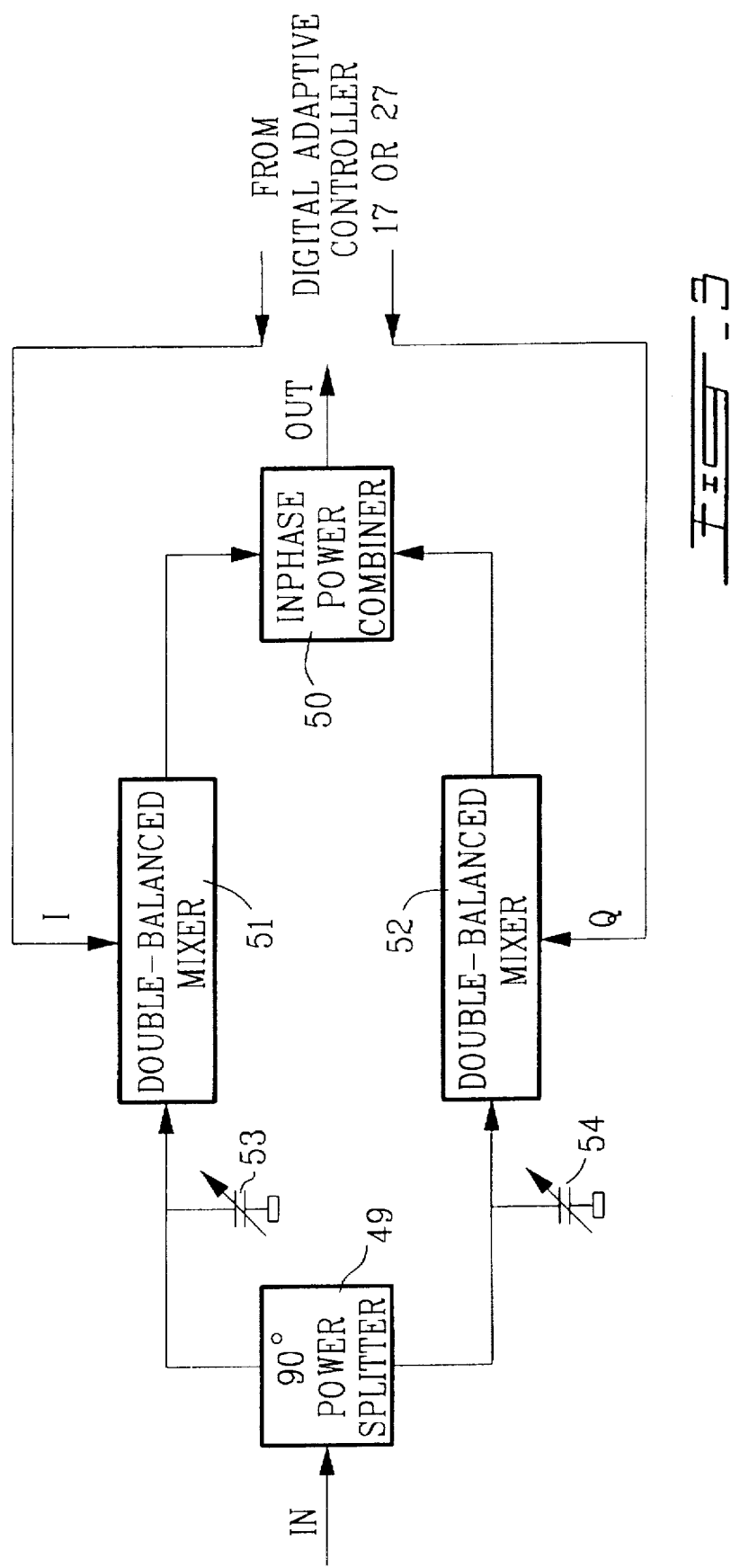
FIG. 3 is a block diagram illustrating the circuit of a vector modulator with unbalance compensation used in the adaptive feedforward amplifier system of FIG. 1.

FIG. 1 is a block diagram of an overall digital adaptive control feedforward amplifier system in accordance with the present invention, comprising digital adaptive control circuits 17 and 27 as illustrated in FIG. 2, and vector modulators 10 and 21 as shown in FIG. 3.

Two pilot signals, $f_{p1}$ and $f_{p2}$, are used to guide a carrier signal cancellation in loop 1, and a distortion cancellation in loop 2.

The first single-frequency pilot signal $f_{p1}$ is constituted by one carrier signal included into an input signal 101 supplied to an amplifier system input (point A). A directional coupler 100 splits the input signal 101 including the first pilot signal $f_{p1}$ into a first input signal portion supplied to the input 110 of a main amplifier 11 through an attenuator 9 and a vector modulator 10, and a second input signal portion.

In response to the signal on the input 110 the main amplifier 11 produces on its output 111 an amplified output signal having a first pilot signal component and a distortion component.

An oscillator 200 generates a second single-frequency pilot signal $f_{p2}$, having a lower level in the order of the intermodulation products. This pilot signal $f_{p2}$ is injected on the output 111 of the main amplifier 11 via a directional coupler 3. Another directional coupler 4 extracts a portion of the amplified output signal, this signal portion being supplied to an attenuator 12 and including a first $f_{p1}$ pilot signal component, a distortion component and a second $f_{p2}$ pilot signal component.

The lower path of loop 1 includes an attenuator 5 and a delay line 6 to set a first reference signal r1 having a first $f_{p1}$ pilot signal component injected into the input port of a Wilkinson-type in-phase combiner 8 through a directional coupler 7. The function of the delay line 6 is to compensate the group delay of the main amplifier 11 within the linearization bandwidth. The upper path of loop I includes the attenuator 9, the, vector modulator 10, the main amplifier 11, the two couplers 3 and 4, the attenuator 12 and a directional coupler 13. As already indicated, the composite output signal of the main amplifier 11 is sampled, together with the second pilot signal $f_{p2}$, through the directional coupler 4 and the attenuator. 12 to form a first adjustable signal a1 injected into another input port of the Wilkinson combiner 8 through a directional coupler 13. If the Wilkinson-type in-phase combiner 8 and the two couplers 7 and 13 are ideal components, the vector modulator 10 is adjusted such that the $f_{p1}$ pilot signal components at point "a1" and "r1" have equal amplitudes but are 180° out of phase (a calibration is given for practical components; it will be described later). Adjustment of the vector modulator 10 in relation to the first reference and adjustable signals is controlled by a digital adaptive controller 17, which will be described in the following description. This leaves at point C (the output port of the Wilkinson combiner 8 an error signal representative of a difference between the first reference and adjustable signals and including: (1) an error component itself including a nonlinear distortion component and thermal noise both generated by the main amplifier 11; (2) the second pilot $f_{p2}$ signal component; and (3) in practice, the residual of the input signal. This error signal is amplified by the auxiliary amplifier to produce an amplified error signal. The purpose of using three attenuators 5, 9 and 12 is to set a proper adjustable range of the vector modulator 10, corresponding to a given input signal dynamic range and a given main amplifier 11.

The upper path of loop 2 is a reference path, where a delay line 18 transmitting the amplified output signal from the main amplifier 11, including the second pilot signal $f_{p2}$ to the amplifier system output, compensates the group delay of an auxiliary amplifier 22 that is used to bring back the detected error component to its original level. Depending on the frequency bandwidth, the delay line 18 may not be required when the delay generated by auxiliary amplifier path is acceptable. The lower path is adjustable by means of the vector modulator 21, which should be adjusted such that the second $f_{p2}$ pilot signals of the two paths are canceled at the output port of the last directional coupler 20, i.e. at point D. The amplified error signal injected onto the amplifier system output through the directional couplers 23 and 20 constitutes a distortion cancelling signal which leaves only the amplified input signal on the amplifier system output with a high degree of cancellation of any order of the distortion products. Also, the noise figure is mainly affected by the auxiliary amplifier 22, not the main amplifier 11. Note that the last coupler 20 must be a directional coupler with a low coupling coefficient, because any loss in the upper path of loop 2 affects directly to the efficiency of the whole feedforward system. Therefore for a well-balanced loop 2, the $f_{p2}$ pilot signals of the upper and lower paths at point "r2" and "a2" are not in equal amplitude and are not out of phase. The method for adjusting the vector modulator 21 will be described hereinafter.

Either for loop 1 or for loop 2, the pilot signals in two paths can be extracted before combining and comparing in the following way, to obtain the necessary adaptive control parameters.

The first reference signal at "r1" is sampled and supplied to a mixer 14 by means of the directional coupler 7, the first adjustable signal at "a1" is sampled and supplied to a mixer 15 by means of the directional coupler 13, the second reference signal at "r2" is sampled by a directional couplers 19 and is supplied to a mixer 24, and the amplified error signal is split by a directional coupler 23 into the above mentioned distortion cancelling signal and a second adjustable signal supplied to a mixer 25. The first reference and adjustable signals are down-converted to a lower frequency bandwidth with a local oscillator 16 and the mixers 14 and 15, respectively, while the second reference and adjustable signals are down-converted to a lower frequency bandwidth by means of a local oscillator 26 and mixers 25 and 24, respectively, to make these signals acceptable by A/D (analog-to-digital) converters. The local oscillators 16 and 26 can be replaced by a single oscillator, if we set $$f_{L1} = f_{L2} = f_L = \frac{1}{2}(f_{p1} - f_{p2}).$$

The converted signals are then treated by the digital adaptive controller 17 (or 27) as shown in FIG. 2.

Referring to FIG. 2, an analog input lowpass filter 28 (or 29) is needed for each A/D channel before the A/D converter 30 (or 31). This filter limits noise and provides anti-aliasing protection. The sampled digital data in the two channels are first multiplied by calibration factors $C_r$ and $C_a$ to compensate for the imperfection of the hardware components. The narrow band digital bandpass FIR (Finite Impulse Response) filters reject all except the pilot ($f_{p1}$ for loop 1, and $f_{p2}$ for loop 2) signals in the two channels. The amplitudes and phases of the two different pilot signals in two channels are needed for comparison purpose. Fast discrete Fourier transformation (FFT) is then calculated to obtain the two complex amplitudes X and -Y from two channels. If X equals to -Y represents the perfect cancellation, the following derivation can be deduced, either for loop 1 or loop 2.

Suppose that $S_p$ is tie input pilot ($f_{p1}$ or $f_{p2}$) at point A (or B); Lr and La represent lose and attenuation in two paths; Dr describes the phase offset of the delay line; Ga is the complex gain of the main (or auxiliary) amplifier; K is the complex value of the vector modulator 10, (or 21) to be adjusted. The complex components of the pilot signal $f_{p1}$ (or $f_{p2}$) at point "r1" and "a1" (or "r2" and "a2") are $S_r$ and $S_a$, respectively. They can be determined by $$S_r = S_p L_r D_r \tag{1}$$

and $$S_a = S_p L_a K G_a \tag{2}$$

For a well balanced loop, it is required that $$S_r \alpha_r + S_a \alpha_a = 0 \tag{3}$$

where $\alpha_r$ and $\alpha_a$ for loop 1 depend on the couplers 7, 8 and 13, and for loop 2 depend on the couplers 19, 20 and 23.

On the other hand, X and Y are obtained from the two channels in the control circuit according to $$X = S_r m_r C_r \tag{4}$$

and $$Y = S_a m_a C_a \tag{5}$$

where $m_r$ and $m_a$ represent the factors due to the directional couplers and the mixers (7,14 and 13,15 for loop 1; 19, 24 and 23, 25 for loop 2); $C_r$ and $C_a$ are calibration factors.

From equations (1) to (5) we can obtain that $$\frac{X}{Y} = -\frac{\alpha_r m_r C_r}{\alpha_a m_a C_a} \tag{6}$$

It means that in order to compensate the imperfections of the Wilkinson combiner and directional couplers, and any unbalance between the mixers, the signals in both paths must be multiplied by two calibration factors, $C_r$ and $C_a$ which can be determined by:

$$\frac{C_r}{C_a} = \frac{\alpha_r m_a}{\alpha_a m_r} \tag{7}$$

Under this condition, X equals to -Y that represents a perfect cancellation.

By experimentally measuring the imperfections of the components, the calibration factors $C_r$ and $C_a$ can be obtained and stored into the program for the digital signal processing. In addition, in order to implement a global perfect performance, the two directional couplers 7, 13 and the Wilkinson combiner a for loop 1, or the three directional couplers 19, 23 and 20 for loop 2, can be integrated as a five-port network by MMIC (Microwave Monolithic Integrated Circuit) technology.

If X does not equal to -Y, one can prove that the vector modulator must be adjusted as follows:

$$K_{n+1} = K_n \left(\frac{X}{Y}\right)_n \tag{8}$$

where n is the index of the frame of the digital data stream with each frame having m digital samples.

An initial value of K is set when the feedforward system starts to work. Then it is updated after one frame of the digital data stream has been processed. Equation (8) shows that every next K is updated from the previous K multiplied by the previous ratio of X/Y. The blocks 39 to 42 in FIG. 2 are employed to implement this algorithm. Finally, the complex value K is split by a splitter 43 to real and imaginary parts to control the vector modulator 10 (or 21). Therefore, two channels of D/A converters 44 and 45 are needed. The purpose of the two output analog filters 46 and 47 is to smooth the output control signals, which is kept constant in each frame during adjusting.

This adaptive control algorithm, theoretically, converges in one adaptive iteration. For any $K_n$, if the loop is not balanced, the next $K_{n+1}$ will make the loop balanced. If any change happens in the loop, for example, the complex gain of the amplifier deviates, the value of that $K_{n+1}$ is no longer satisfied with the new balance requirement. However, a next $K_{n+2}$ will make the loop re-balanced for the new operation condition, providing that this variation speed is lower than the update-time of K.

The update-time ($T_u$) can be estimated by:

$$T_u = \frac{m}{f_s} \quad (9)$$

where $f_s$ is limited by the maximum sample rate of the A/D converter, m is limited by the response time of the FIR filter and the necessary sampled data for FFT calculation.

In practice, there are imperfection of the calibration and other mismatch in the system, therefore X/Y only can approach to unity and a few time slots of $T_u$ are needed. The convergence time of the presented algorithm is very fast, which takes about a few ms in practice.

The block diagram of FIG. 2 can be implemented by a DSP (digital signal processor) chip, a two-channel A/D converters fitted with input and output filters, and the necessary interface circuits 48. They can be integrated into the overall feedforward amplifier system.

The vector modulator 10 (or 21) is conventional and is shown in FIG. 3. In order to have a high quality of the quadrature modulation, two capacitors 53 and 54 are introduced to compensate the possible unbalance due to the imperfections of the components 49–52. It leads to a high precision needed for the adaptive control requirement.

Figure 4:
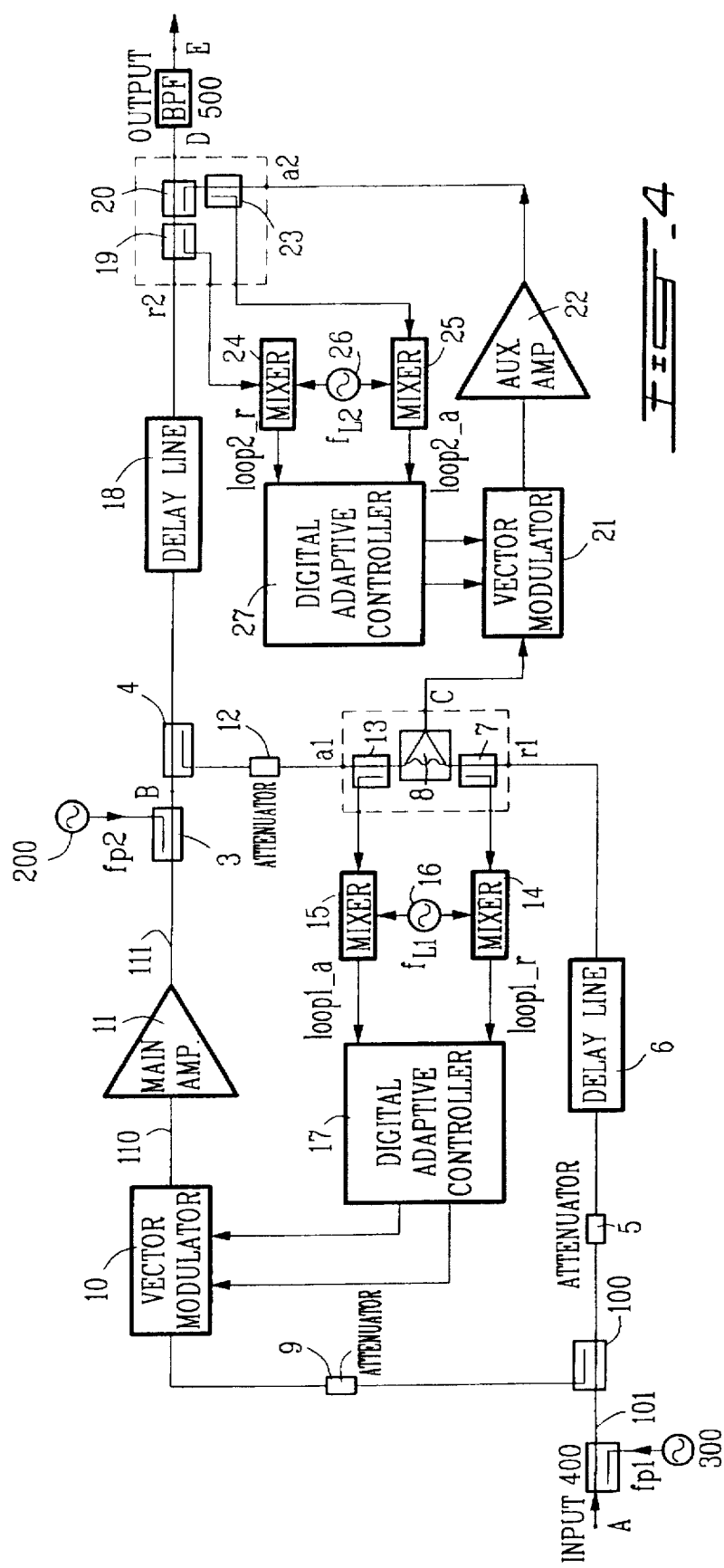
FIG. 4 is a block diagram illustrating the circuit of an adaptive feedforward amplifier system where the first pilot signal is provided by a generator rather than using one carrier frequency of the input signal.

The difference between FIG. 4 and FIG. 1 is that the first pilot signal $f_{p1}$ is produced by a generator 300, rather than using one carrier as the first pilot signal. This pilot signal $f_{p1}$ is injected into the input signal at the amplifier system input via a directional coupler 400. Therefore, the feedforward amplifier system input 101 is supplied with a signal formed of the input signal at point A and the first pilot signal.

In this case, the procedures of the signal processing including the adaptive control of the two loops are similar to those having been described with reference to FIGS. 1, 2 and 3. However, a bandpass filter 560 is added after the last coupler 20 at the amplifier system output to reject the first pilot signal component reaching the output of that coupler 20.

Although the present invention has been described hereinabove with reference to a preferred embodiment thereof, this embodiment can be modified at will, within the scope of the appended claims, without departing from the spirit and nature of the subject invention.

What is claimed is:

1. An adaptively controlled feedforward amplifier system comprising:

a main amplifier having an amplifier input and an amplifier output, the amplifier input being supplied with an input signal including a pilot signal component, the input signal having an amplitude and a phase, and the main amplifier being responsive to the input signal on the amplifier input to produce on the amplifier output an amplified output signal having a pilot signal component;

means for extracting a portion of the input signal and for converting the extracted input signal portion to a reference signal having a pilot signal component;

means for extracting a portion of the amplified output signal and for converting the extracted output signal portion to an adjustable signal having a pilot signal component; and an adaptive control circuit having means responsive to the reference signal for calculating a first amplitude- and phase-representative Fourier transform of the pilot signal component of said reference signal, means responsive to the adjustable signal for calculating a second amplitude- and phase-representative Fourier transform of the pilot signal component of said adjustable signal, and means for adjusting the amplitude and phase of the input signal before being supplied to the amplifier input but after extraction of the input signal portion, to values making the first and second Fourier transforms substantially equal in amplitude but substantially opposite in phase.

2. An adaptively controlled feedforward amplifier system as recited in claim 1, wherein said means for adjusting the amplitude and phase of the input signal comprises:

a vector modulator through which said input signal is supplied to the amplifier input;

means for calculating a ratio between the first and second Fourier transforms; and means for controlling the vector modulator in relation to the calculated ratio so as to make said calculated ratio substantially equal to −1.

3. An adaptively controlled amplifier system comprising:

an amplifier having an amplifier input and an amplifier output, the amplifier input being supplied with an analog input signal including a pilot signal component, the analog input signal having an amplitude and a phase, and the amplifier being responsive to the analog input signal on the amplifier input to produce on the amplifier output an analog amplified output signal having a pilot signal component;

means for extracting a portion of the analog input signal and for converting the extracted analog input signal portion into an analog reference signal having a pilot signal component;

means for extracting a portion of the analog amplified output signal and for converting the extracted analog amplified output signal portion into an analog adjustable signal having a pilot signal component; and an adaptive control circuit having:

a first analog-to-digital converter for converting the analog reference signal to a digital reference signal, first filter means for extracting the pilot signal component from the digital reference signal, and digital means for calculating a first discrete Fourier transform of the pilot signal component extracted from the digital reference signal;

a second analog-to-digital converter for converting the analog adjustable signal to a digital adjustable signal, second filter means for extracting the pilot signal component from the digital adjustable signal, and digital means for calculating a second discrete Fourier transform of the pilot signal component extracted from the digital adjustable signal; and means for adjusting the amplitude and phase of the analog input signal before being supplied to the amplifier input but after extraction of the analog input signal portion, to values making the first and second Fourier transforms substantially equal in amplitude but substantially opposite in phase.

4. An adaptively controlled amplifier system as recited in claim 3, wherein said adaptive control circuit further comprises:

a first analog input low pass filter for limiting noise and providing anti-aliasing protection, the analog reference signal being transmitted to the first analog-to-digital converter through the first analog input low pass filter;

and a second analog input low pass filter for limiting noise and providing anti-aliasing protection, the analog adjustable signal being transmitted to the second analog-to-digital converter through the second analog input low pass filter.

5. A feedforward amplifier system comprising:

an amplifier system input for receiving an input signal including a pilot signal component;

an amplifier system output;

a main amplifier having a main amplifier input supplied with the input signal, the main amplifier being responsive to the input signal on the main amplifier input to produce an amplified output signal having a pilot signal component and supplied to the amplifier system output;

an adaptive control loop including:

means for extracting a portion of the input signal and for converting the extracted input signal portion to a reference signal having a pilot signal component;

means for extracting a portion of the amplified output signal from the main amplifier and for converting the extracted amplified output signal portion to an adjustable signal having a pilot signal component; and an adaptive control circuit having means responsive to the reference signal for calculating a first amplitude- and phase-representative Fourier transform of the pilot signal component of said reference signal, means responsive to the adjustable signal for calculating a second amplitude- and phase-representative Fourier transform of the pilot signal component of said adjustable signal, and means interposed between the amplifier system input and the main amplifier input for adjusting the amplitude and phase of the input signal before being supplied to the main amplifier input but after extraction of the input signal portion, to values making the first and second Fourier transforms substantially equal in amplitude but substantially opposite in phase; and means responsive to the reference and adjustable signals and to the amplified output signal for producing a distortion canceling signal injected onto the amplifier system output to cancel a distortion component of the amplified output signal.

6. A feedforward amplifier system as recited in claim 5, in which said means for extracting a portion of the input signal and for converting the extracted input signal portion to a reference signal comprises:

a directional coupler for dividing the input signal into a first input signal portion constituting said extracted input signal portion, and a second input signal portion supplied to the main amplifier input; and an attenuator and delay line combination for attenuating and phase shifting the first input signal portion to produce the reference signal having a pilot signal component.

7. A feedforward amplifier system as recited in claim 5, in which said means for extracting a portion of the amplified output signal and for converting the extracted amplified output signal portion to an adjustable signal comprises:

a directional coupler for extracting said portion of the amplified output signal from the main amplifier; and an attenuator for attenuating said extracted amplified output signal portion to thereby produce the adjustable signal.

8. A feedforward amplifier system as recited in claim 5, wherein said means for adjusting the amplitude and phase of the input signal comprises:

a vector modulator interposed between the amplifier system input and the main amplifier input;

means for calculating a ratio between the first and second Fourier transforms; and means for controlling the vector modulator in relation to the calculated ratio to make said calculated ratio substantially equal to −1.

9. A feedforward amplifier system comprising:

an amplifier system input for receiving an analog input signal including a pilot signal component;

an amplifier system output;

a main amplifier having a main amplifier input supplied with the analog input signal, the main amplifier being responsive to the analog input signal on the main amplifier input to produce an analog amplified output signal having a pilot signal component and supplied to the amplifier system output;

an adaptive control loop including:

means for extracting a portion of the analog input signal and for converting the extracted analog input signal portion to an analog reference signal having a pilot signal component;

means for extracting a portion of the analog amplified output signal from the main amplifier and for converting the extracted analog amplified output signal portion to an analog adjustable signal having a pilot signal component; and an adaptive control circuit having:

a first analog-to-digital converter for converting the analog reference signal to a digital reference signal, first filter means for extracting the pilot signal component from the digital reference signal, and digital means for calculating a first discrete Fourier transform of the pilot signal component extracted from the digital reference signal;

a second analog-to-digital converter for converting the analog adjustable signal to a digital adjustable signal, second filter means for extracting the pilot signal component from the digital adjustable signal, and digital means for calculating a second discrete Fourier transform of the pilot signal component extracted from the digital adjustable signal; and means interposed between the amplifier system input and the main amplifier input for adjusting the amplitude and phase of the analog input signal before being supplied to the main amplifier input but after extraction of the analog input signal portion, to values making the first and second Fourier transforms substantially equal in amplitude but substantially opposite in phase; and means responsive to the analog reference and adjustable signals and to the analog amplified output signal for producing an analog distortion canceling signal injected onto the amplifier system output to cancel a distortion component of the analog amplified output signal.

10. A feedforward amplifier system as recited in claim 9, wherein said adaptive control circuit further comprises:

a first analog input low pass filter for limiting noise and providing anti-aliasing protection, the analog reference signal being transmitted to the first analog-to-digital converter through the first analog input low pass filter; and a second analog input low pass filter for limiting noise and providing anti-aliasing protection, the analog adjustable signal being transmitted to the second analog-to-digital converter through the second analog input low pass filter.

11. A feedforward amplifier system comprising:

an amplifier system input for receiving an input signal;

an amplifier system output;

a main amplifier having a main amplifier input supplied with the input signal and a main amplifier output, the main amplifier being responsive to the input signal on the main amplifier input to produce on the main amplifier output an amplified output signal having a distortion component;

means for injecting a pilot signal into the amplified output signal on the main amplifier output;

means for transmitting the amplified output signal including the pilot signal and the distortion component from the main amplifier output to the amplifier system output;

means responsive to the input signal and the amplified output signal on the main amplifier output for adjusting an amplitude and a phase of the input signal on the main amplifier input to values establishing a given relationship between a given signal component of the input signal and a given signal component of the amplified output signal;

means responsive to the input signal and the amplified output signal on the main amplifier output for producing an error signal representative of the distortion component of the amplified output signal and including a pilot signal component;

an auxiliary amplifier for amplifying the error signal to produce an amplified error signal including a pilot signal component and a distortion component;

means responsive to the amplified output signal on the amplifier system output for producing a reference signal having a pilot signal component;

means responsive to the amplified error signal for producing an adjustable signal having a pilot signal component and a distortion canceling signal injected onto the amplifier system output to cancel a distortion component of the amplified output signal; and an adaptive control circuit having means responsive to the reference signal for calculating a first amplitude- and phase-representative Fourier transform of the pilot signal component of said reference signal, means responsive to the adjustable signal for calculating a second amplitude- and phase-representative Fourier transform of the pilot signal component of said adjustable signal, and means for adjusting an amplitude and a phase of the error signal supplied to the auxiliary amplifier to values making the first and second Fourier transforms substantially equal in amplitude but substantially opposite in phase.

12. A feedforward amplifier system as recited in claim 11, in which the transmitting means comprises a delay line for interconnecting the main amplifier output to the amplifier system output.

13. A feedforward amplifier system as recited in claim 11, wherein:

said means for producing a reference signal comprises a directional coupler for extracting said reference signal from the amplified output signal on the amplifier system output; and said means for producing an adjustable signal and a distortion canceling signal comprises a directional coupler for dividing the amplified error signal into said adjustable signal and said distortion canceling signal.

14. A feedforward amplifier system as recited in claim 11, wherein said means for adjusting the amplitude and phase of the error signal comprises:

a vector modulator through which the error signal is supplied to the auxiliary amplifier;

means for calculating a ratio between the first and second Fourier transforms; and means for controlling the vector modulator in relation to the calculated ratio to make said calculated ratio substantially equal to 1.

15. A feedforward amplifier system comprising:

an amplifier system input for receiving an analog input signal;

an amplifier system output;

a main amplifier having a main amplifier input supplied with the analog input signal and a main amplifier output, the main amplifier being responsive to the analog input signal on the main amplifier input to produce on the main amplifier output an analog amplified output signal having a distortion component;

means for injecting a pilot signal into the analog amplified output signal on the main amplifier output;

means for transmitting the analog amplified output signal including the pilot signal and the distortion component from the main amplifier output to the amplifier system output;

means responsive to the analog input signal and the analog amplified output signal on the main amplifier output for adjusting an amplitude and a phase of the analog input signal on the main amplifier input to values establishing a given relationship between a given signal component of the analog input signal and a given signal component of the analog amplified output signal;

means responsive to the analog input signal and the analog amplified output signal on the main amplifier output for producing an analog error signal representative of the distortion component of the analog amplified output signal and including a pilot signal component;

an auxiliary amplifier for amplifying the analog error signal to produce an analog amplified error signal including a pilot signal component and a distortion component;

means responsive to the analog amplified output signal on the amplifier system output for producing an analog reference signal having a pilot signal component;

means responsive to the analog amplified error signal for producing an analog adjustable signal having a pilot signal component and an analog distortion canceling signal injected onto the amplifier system output to cancel a distortion component of the analog amplified output signal; and an adaptive control circuit having: a first analog-to-digital converter for converting the analog reference signal to a digital reference signal, (b) first filter means for extracting the pilot signal component from the digital reference signal, and (c) digital means for calculating a first amplitude- and phase-representative discrete Fourier transform of the pilot signal component of the digital reference signal; and a second analog-to-digital converter for converting the analog adjustable signal to a digital adjustable signal, second filter means for extracting the pilot signal component from the digital adjustable signal, and digital means for calculating a second amplitude- and phase-representative discrete Fourier transform of the pilot signal component of the digital adjustable signal; and means for adjusting an amplitude and a phase of the analog error signal supplied to the auxiliary amplifier to values making the first and second Fourier transforms substantially equal in amplitude but substantially opposite in phase.

16. A feedforward amplifier system as recited in claim 15, wherein said adaptive control circuit further comprises:

a first analog input low pass filter for limiting noise and providing anti-aliasing protection, the analog reference signal being transmitted to the first analog-to-digital converter through the first analog input low pass filter; and a second analog input low pass filter for limiting noise and providing anti-aliasing protection, the analog adjustable signal being transmitted to the second analog-to-digital converter through the second analog input low pass filter.

17. A feedforward amplifier system comprising:

an amplifier system input for receiving an input signal including a first pilot signal component;

an amplifier system output;

a main amplifier having a main amplifier input supplied with the input signal and a main amplifier output, the main amplifier being responsive to the input signal on the main amplifier input to produce on the main amplifier output an amplified output signal having a first pilot signal component and a distortion component;

means for injecting a second pilot signal into the amplified output signal;

means for transmitting the amplified output signal including the second pilot signal from the main amplifier output to the amplifier system output;

a first adaptive control loop including:

means for extracting a portion of the input signal and for converting the extracted input signal portion to a first reference signal having a first pilot signal component;

means for extracting a portion of the amplified output signal on the main amplifier output and for converting the extracted amplified output signal portion to a first adjustable signal having a first pilot signal component, a second pilot signal component and a distortion component; and an adaptive control circuit having means responsive to the first reference signal for calculating a first amplitude- and phase-representative Fourier transform of the first pilot signal component of the first reference signal, means responsive to the first adjustable signal for calculating a second amplitude- and phase-representative Fourier transform of the first pilot signal component of said first adjustable signal, and means interposed between the amplifier system input and the main amplifier input for adjusting an amplitude and a phase of the input signal before being supplied to the main amplifier input but after extraction of the input signal portion to values making the first and second Fourier transforms substantially equal in amplitude but substantially opposite in phase; and a second adaptive control loop including:

means for producing an error signal representative of a difference between the first reference signal and the first adjustable signal and including a second pilot signal component and a distortion component;

an auxiliary amplifier for amplifying the error signal to produce an amplified error signal including a second pilot signal component and a distortion component;

means responsive to the amplified output signal on the amplifier system output for producing a second reference signal having a second pilot signal component;

means responsive to the amplified error signal for producing a second adjustable signal having a second pilot signal component and a distortion canceling signal injected onto the amplifier system output to cancel a distortion component of the amplified output signal; and an adaptive control circuit having means responsive to the second reference signal for calculating a third amplitude- and phase- representative Fourier transform of the second pilot signal component of said second reference signal, means responsive to the second adjustable signal for calculating a fourth amplitude- and phase-representative Fourier transform of the second pilot signal component of said second adjustable signal, and means for adjusting an amplitude and a phase of the error signal supplied to the auxiliary amplifier to values making the third and fourth Fourier transforms substantially equal in amplitude but substantially opposite in phase.

18. A feedforward amplifier system as recited in claim 17, in which the transmitting means comprises a delay line for interconnecting the main amplifier output to the amplifier system output.

19. A feedforward amplifier system as recited in claim 17, in which said means for extracting a portion of the input signal and for converting the extracted input signal portion to a first reference signal comprises:

a directional coupler for dividing the input signal into a first input signal portion, and a second input signal portion supplied to the main amplifier input; and an attenuator and delay line combination for attenuating and phase shifting the first input signal portion in order to produce the first reference signal having a first pilot signal component.

20. A feedforward amplifier system as recited in claim 17, in which said means for extracting a portion of the amplified output signal and for converting the extracted amplified output signal portion to a first adjustable signal comprises:

a directional coupler for extracting said portion of the amplified output signal on the main amplifier output; and an attenuator for attenuating said portion of the amplified output signal to produce said first adjustable signal.

21. A feedforward amplifier system as recited in claim 17, wherein said means for adjusting the amplitude and phase of the input signal comprises:

a vector modulator interposed between the amplifier system input and the main amplifier input;

means for calculating a ratio between the first and second Fourier transforms; and means for controlling the vector modulator in relation to the calculated ratio to make said calculated ratio substantially equal to 1.

22. A feedforward amplifier system as recited in claim 17, wherein: said means for producing an error signal comprises means for calculating a difference between the first reference signal and the first adjustable signal;

said means for producing a second reference signal comprises a directional coupler for extracting the second reference signal from the amplified output signal on the amplifier system output; and said means for producing a second adjustable signal and a distortion canceling signal comprises a directional coupler for dividing the amplified error signal into the second adjustable signal and the distortion canceling signal.

23. A feedforward amplifier system as recited in claim 17, wherein said means for adjusting the amplitude and phase of the error signal comprises:

a vector modulator through which the error signal is supplied to the auxiliary amplifier;

means for calculating a ratio between the third and fourth Fourier transforms; and means for controlling the vector modulator in relation to the calculated ratio to make said calculated ratio substantially equal to 1.

24. A feedforward amplifier system comprising:

an amplifier system input for receiving an analog input signal including a first pilot signal component;

an amplifier system output;

a main amplifier having a main amplifier input supplied with the analog input signal and a main amplifier output, the main amplifier being responsive to the analog input signal on the main amplifier input to produce on the main amplifier output an analog amplified output signal having a first pilot signal component and a distortion component;

means for injecting a second pilot signal into the analog amplified output signal;

means for transmitting the analog amplified output signal including the second pilot signal from the main amplifier output to the amplifier system output;

a first adaptive control loop including:

means for extracting a portion of the analog input signal and for converting the extracted analog input signal portion to a first analog reference signal having a first pilot signal component;

means for extracting a portion of the analog amplified output signal on the main amplifier output and for converting the extracted analog amplified output signal portion to a first analog adjustable signal having a first pilot signal component, a second pilot signal component and a distortion component; and an adaptive control circuit having (a) a first analog-to-digital converter for converting the first analog reference signal to a first digital reference signal, first filter means for extracting the first pilot signal component from the first digital reference signal, and digital means for calculating a first discrete Fourier transform of the first pilot signal component extracted from the first digital reference signal, and (b) a second analog-to-digital converter for converting the first analog adjustable signal to a first digital adjustable signal, second filter means for extracting the first pilot signal component from the first digital adjustable signal, and digital means for calculating a second discrete Fourier transform of the first pilot signal component extracted from the first digital adjustable signal; and (c) means interposed between the amplifier system input and the main amplifier input for adjusting an amplitude and a phase of the analog input signal before being supplied to the main amplifier input but after extraction of the analog input signal portion, to values making the first and second Fourier transforms substantially equal in amplitude but substantially opposite in phase; and a second adaptive control loop including:

means for producing an analog error signal representative of a difference between the first analog reference signal and the first analog adjustable signal and including a second pilot signal component and a distortion component;

an auxiliary amplifier for amplifying the analog error signal to produce an amplified analog error signal including a second pilot signal component and a distortion component;

means responsive to the analog amplified output signal on the amplifier system output for producing a second analog reference signal having a second pilot signal component;

means responsive to the amplified analog error signal for producing a second analog adjustable signal having a second pilot signal component and an analog distortion canceling signal injected onto the amplifier system output to cancel a distortion component of the analog amplified output signal; and an adaptive control circuit having means responsive to the second analog reference signal for calculating a third amplitude- and phase- representative Fourier transform of the second pilot signal component of said second analog reference signal, means responsive to the second analog adjustable signal for calculating a fourth amplitude- and phase-representative Fourier transform of the second pilot signal component of said second analog adjustable signal, and means for adjusting an amplitude and a phase of the error signal supplied to the auxiliary amplifier to values making the third and fourth Fourier transforms substantially equal in amplitude but substantially opposite in phase.

25. A feedforward amplifier system as recited in claim 24, wherein said adaptive control circuit of the first adaptive control loop further comprises:

a first analog input low pass filter for limiting noise and providing anti-aliasing protection, the first analog reference signal being transmitted to the first analog-to-digital converter through the first analog input low pass filter; and a second analog input low pass filter for limiting noise and providing anti-aliasing protection, the first analog adjustable signal being transmitted to the second analog-to-digital converter through the second analog input low pass filter.

26. A feedforward amplifier system as recited in claim 24, wherein the adaptive control circuit of the first adaptive control loop further comprises:

first means interposed between the first analog-to-digital converter and the first filter means for multiplying the first digital reference signal by a first calibration factor; and second means interposed between the second analog-to-digital converter and the second filter means for multiplying the first digital adjustable signal by a second calibration factor.

27. A feedforward amplifier system comprising:

an amplifier system input for receiving an analog input signal including a first pilot signal component;

an amplifier system output;

a main amplifier having a main amplifier input supplied with the analog input signal and a main amplifier output, the main amplifier being responsive to the analog input signal on the main amplifier input to produce on the main amplifier output an analog amplified output signal having a first pilot signal component and a distortion component;

means for injecting a second pilot signal into the analog amplified output signal;

means for transmitting the analog amplified output signal including the second pilot signal from the main amplifier output to the amplifier system output;

a first adaptive control loop including:

means for extracting a portion of the analog input signal and for converting the extracted analog input signal portion to a first analog reference signal having a first pilot signal component;

means for extracting a portion of the analog amplified output signal on the main amplifier output and for converting the extracted analog amplified output signal portion to a first analog adjustable signal having a first pilot signal component, a second pilot signal component and a distortion component; and an adaptive control circuit having means responsive to the first analog reference signal for calculating a first amplitude- and phase- representative Fourier transform of the first pilot signal component of said first analog reference signal, means responsive to the first analog adjustable signal for calculating a second amplitude- and phase- representative Fourier transform of the first pilot signal component of said first analog adjustable signal, and means for adjusting an amplitude and a phase of the analog input signal before being supplied to the main amplifier input but after extraction of the analog input signal portion to values making the first and second Fourier transforms substantially equal in amplitude but substantially opposite in phase;

a second adaptive control loop including:

means for producing an analog error signal representative of a difference between the first analog reference signal and the first analog adjustable signal and including a second pilot signal component and a distortion component;

an auxiliary amplifier for amplifying the analog error signal to produce an amplified analog error signal including a second pilot signal component and a distortion component;

means responsive to the analog amplified output signal on the amplifier system output for producing a second analog reference signal having a second pilot signal component;

means responsive to the amplified analog error signal for producing a second analog adjustable signal having a second pilot signal component and an analog distortion canceling signal injected onto the amplifier system output to cancel a distortion component of the analog amplified output signal; and an adaptive control circuit having (a) a first analog-to-digital converter for converting the second analog reference signal to a second digital reference signal, first filter means for extracting the second pilot signal component from the second digital reference signal, and digital means for calculating a third discrete Fourier transform of the second pilot signal component of the second digital reference signal, and (b) a second analog-to-digital converter for converting the second analog adjustable signal to a second digital adjustable signal, second filter means for extracting the second pilot signal component from the second digital adjustable signal, and digital means for calculating a fourth discrete Fourier transform of the second pilot signal component of the second digital adjustable signal; and (c) means for adjusting an amplitude and a phase of the analog error signal supplied to the auxiliary amplifier to values making the third and fourth Fourier transforms substantially equal in amplitude but substantially opposite in phase.

28. A feedforward amplifier system as recited in claim 27, wherein the adaptive control circuit of said second adaptive control loop further comprises:

a first analog input low pass filter for limiting noise and providing anti-aliasing protection, the second analog reference signal being transmitted to the first analog-to-digital converter through the first analog input low pass filter; and a second analog input low pass filter for limiting noise and providing anti-aliasing protection, the second analog adjustable signal being transmitted to the second analog-to-digital converter through the second analog input low pass filter.

29. A feedforward amplifier system as recited in claim 27, wherein the adaptive control circuit of said second adaptive control loop further comprises:

first means interposed between the first analog-to-digital converter and the first filter means for multiplying the second digital reference signal by a first calibration factor; and second means interposed between the second analog-to-digital converter and the second filter means for multiplying the second digital adjustable signal by a second calibration factor.

* * * * *

UNITED STATES PATENT AND TRADEMARK OFFICE
CERTIFICATE OF CORRECTION

PATENT NO. : 5,789,976

DATED : AUGUST 4, 1998

INVENTOR(S) : GHANNOUCHI ET AL.

It is certified that error appears in the above-identified patent and that said Letters Patent is hereby corrected as shown below:

Front page, [75] Inventors: "Apmar" should read --Ammar--

Col. 2, line 25: "first control" should read --reference--

Col. 8, line 41: "a" should read --8--

Signed and Sealed this

Fourteenth Day of March, 2000

*Attest:*

*Attesting Officer*

Q. TODD DICKINSON

*Commissioner of Patents and Trademarks*